US006635952B2

(12) United States Patent
Inoh et al.

(10) Patent No.: US 6,635,952 B2
(45) Date of Patent: Oct. 21, 2003

(54) SEMICONDUCTOR DEVICE (75) Inventors: Kazumi Inoh, Yokohama (JP); Shigeru Kawanaka, Yokohama (JP); Yoshihiro Minami, Fujisawa (JP); Yasuhiro Katsumata, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/106,371

(22) Filed: Mar. 27, 2002

(65) Prior Publication Data

US 2002/0140115 A1 Oct. 3, 2002

(30) Foreign Application Priority Data

Mar. 27, 2001 (JP) ......................................... 2001-090909

(51) Int. Cl.[7] ............................................... H01L 29/06
(52) U.S. Cl. ....................... 257/618; 257/622; 257/626; 257/797
(58) Field of Search ................................ 257/758, 756, 257/797, 618, 622, 626

(56) References Cited

U.S. PATENT DOCUMENTS 4,833,519 A * 5/1989 Kawano et al.
5,463,254 A * 10/1995 Iyer et al.
5,895,948 A * 4/1999 Mori et al.
6,501,189 B1 * 12/2002 Kim et al.

FOREIGN PATENT DOCUMENTS

| JP | 7-106434 | 4/1995 |
| JP | 11-238860 | 8/1999 |
| JP | 2000-91534 | 3/2000 |

* cited by examiner

Primary Examiner—Sheila V. Clark
(74) Attorney, Agent, or Firm—Oblon, Spivak, McClelland, Maier & Neustadt, P.C.

(57) ABSTRACT

A semiconductor device comprises: a semiconductor substrate; an insulating layer provided on said semiconductor substrate; a first semiconductor layer provided on said insulating layer; a plurality of openings penetrating said first semiconductor layer and said insulating layer and reaching said semiconductor substrate; and second semiconductor layers filling said openings by selective growth and connected to said semiconductor substrate, wherein areal sizes of said plurality of openings are substantially equal to each other.

15 Claims, 9 Drawing Sheets

SEMICONDUCTOR DEVICE

CROSS REFERENCE TO RELATED APPLICATION

This application is based upon and claims the benefit of priority from the prior Japanese Patent Application No. 2001-090909 filed on Mar. 27, 2001; the entire contents of which are incorporated herein by reference.

BACKGROUND OF THE INVENTION

The present invention relates generally to a semiconductor device using an SOI substrate, and more particularly to a semiconductor device suited to a high-speed logic LSI.

Over the recent years, there has been attempted a scheme of attaining both of a speed-up of LSI and a reduction in consumption of the electric power by utilizing an SOI (Silicon On Insulator) substrate.

Figure 12:
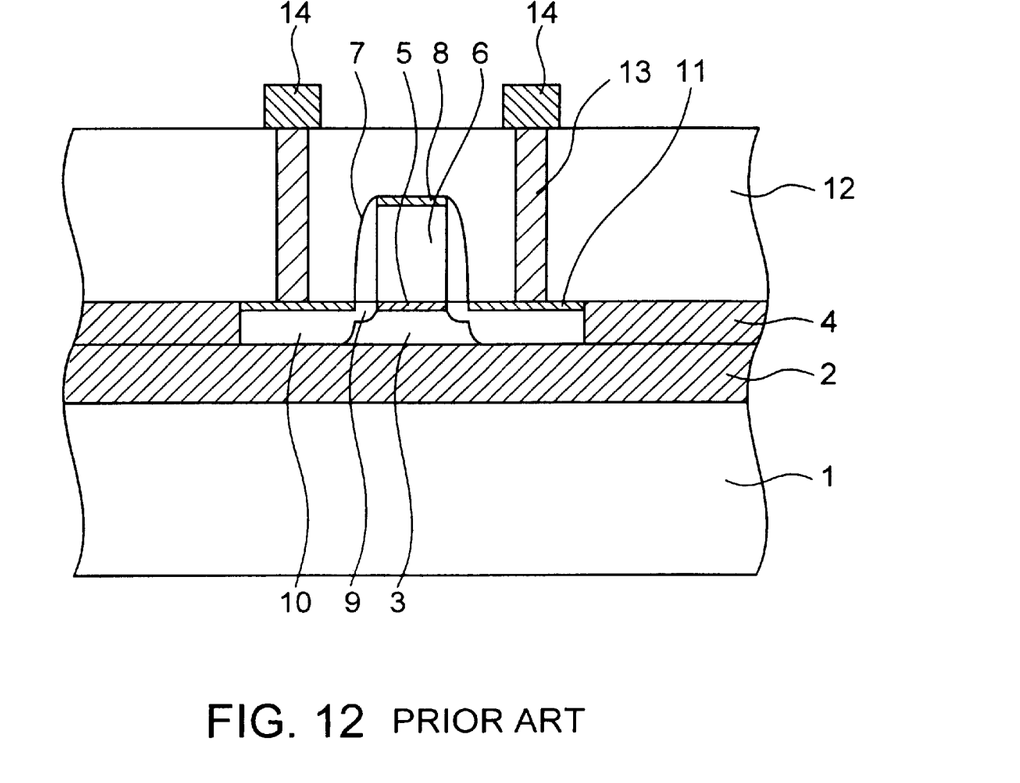
FIG. 12 is a device sectional view showing one example of a semiconductor device using an SOI substrate.

FIG. 12 is a device sectional view showing one example of a semiconductor device using the SOI substrate described above. FIG. 12 illustrates how a MOSFET is manufactured by use of the SOI substrate including a buried oxide layer (BOX layer) 2 and an active silicon layer (SOI layer) 3 provided on a silicon substrate (support substrate) 1.

This MOSFET is configured such that a gate insulating film 5 is provided in a region where a channel is to be formed on the surface of a region surrounded by an element isolation layer 4 in the active silicon layer 3, a gate electrode 6 having side walls 7 and a metal silicide layer 8 on the surface thereon is provided on the gate insulating film 5, and high-concentration source/drain regions 10 and a low-concentration ion implantation regions 9 taking an LDD structure are provided sideways of the gate electrode in the active silicon layer 3. A metal silicide layer 11 is provided on the surface of the high-concentration source/drain regions 10. This metal silicide layer 11 is connected to a tungsten film 13 filled into a contact openings formed in an inter-layer insulating layer 12 and led out as a source/drain electrode 14 on the inter-layer insulating layer 12.

The thus configured MOSFET is capable of attaining a remarkable reduction in parasitic capacitance of the source/drain region 10, and therefore a speed-up of the device can be expected.

Besides, this MOSFET basically does not have much difference from the MOSFET using a normal bulk wafer except that the substrate is the SOI substrate. Accordingly, especially in the case of a partial depletion type MOSFET, the manufacturing process is almost the same except for having different conditions such as an ion implantation and so on.

As a result, the SOI semiconductor device can be manufactured on a trial basis simply by using the SOI substrate as the substrate, wherein the manufacturing process using the bulk substrate is applied as it is. The SOI semiconductor device therefore has an advantage that the performance can be enhanced without any rise in load on the development.

Furthermore, with a demand for speeding up the system with respect to the semiconductor device utilizing the SOI technology, there has increasingly been a request for providing a memory device such as a DRAM etc and a logic device on the same chip. Under such circumstances, there arises a necessity of mounting the high-speed logical circuit and the memory device together on the SOI substrate. A problem of deteriorating a retention, however, arises, wherein the DRAM on the SOI substrate is easy to cause a leak of electric charges and required to be frequently refreshed.

For avoiding this problem, a scheme of adopting an SOI substrate partially having the bulk structure is proposed.

Figure 13:
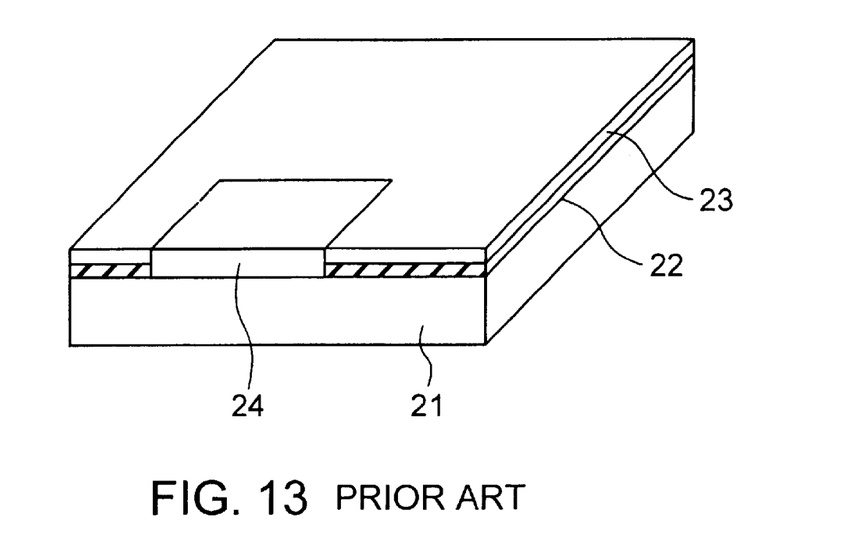
FIG. 13 is a perspective view with some portion depicted in section, showing a conventional SOI substrate having a partial bulk structure.

FIG. 13 is a sectional perspective view showing this structure.

This SOI substrate has such a basic structure that an buried oxide layer 22 and an upper silicon layer 23 are stacked on a silicon substrate 21, wherein the upper silicon layer 23 and the buried oxide layer 22 are partially opened, and these openings are filled with selective epitaxial growth layers 24 to connect with the substrate 21, thus providing the partial bulk structure.

In the case of providing the DRAM in this region, the problem of retention can be avoided.

When using the SOI substrate, however, there is the following problem with respect to forming an identifying mark.

When manufacturing the LSI on the trial basis, a wafer used is marked in its specified position with a number etc for identifying the wafer. Hence, for example, the substrate is irradiated with laser beams so that the substrate is formed with crater-like cavities having a diameter on the order of 50 through 70 μm and a depth on the order of 2 through 4 μm, and numerals and characters are expressed by utilizing an aggregation of these cavities.

Figure 14A:
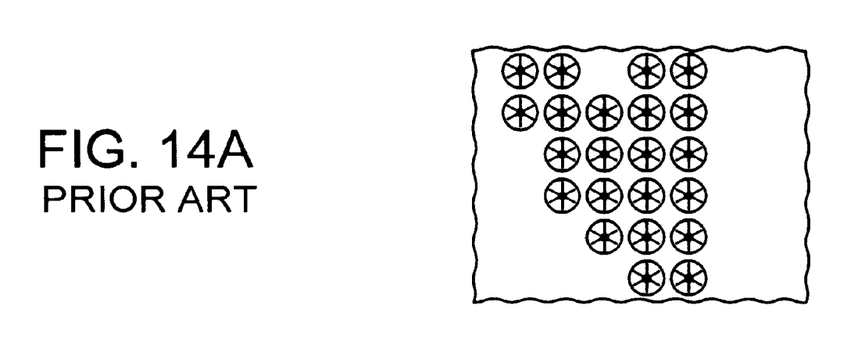
FIGS. 14A through 14C are explanatory views showing a problem about marking the number on the conventional SOI substrate.
Figure 14B:
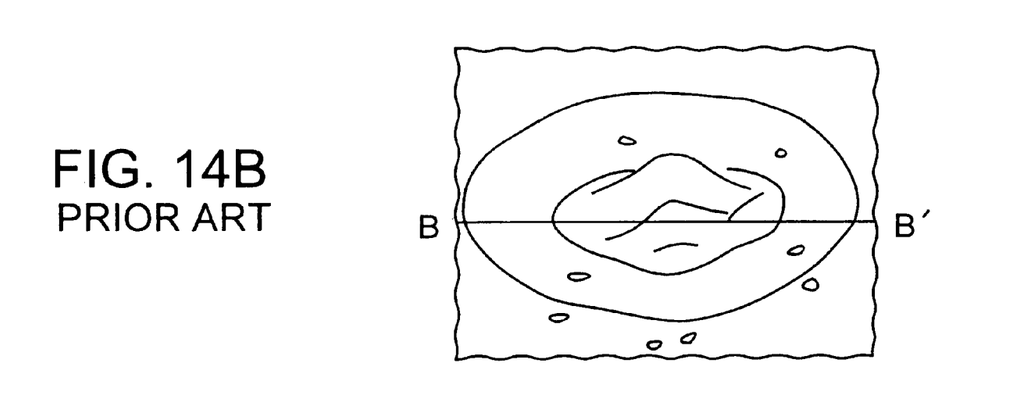
Figure 14C:
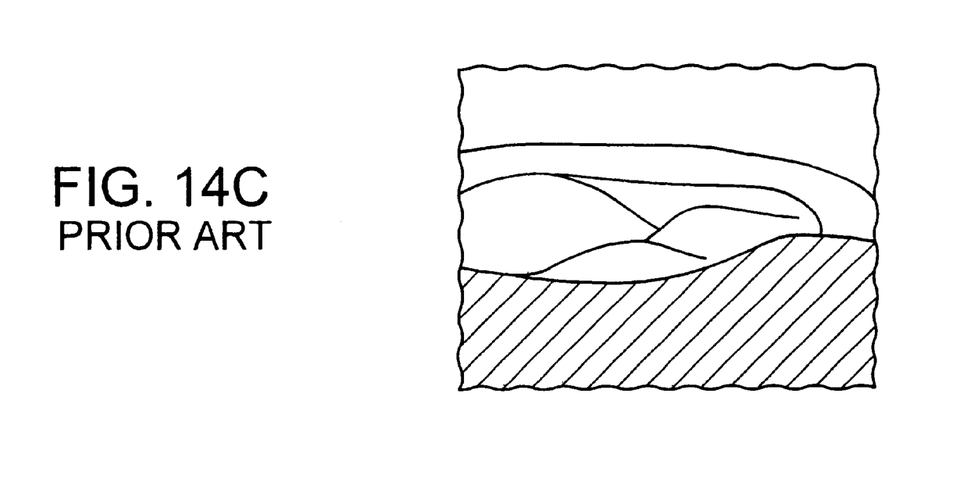

FIGS. 14A through 14C show how numbering is effected on the SOI substrate by executing the same process. FIG. 14A is a view showing these cavities as viewed from above. FIG. 14B is a view showing the same cavities as viewed obliquely from above. FIG. 14C is a view showing the same cavities as viewed in section taken along the line B—B' in FIG. 14B.

When the numbering is thus effected on the SOI substrate, as can be seen from the enlarged view in FIG. 14B, minute dusts are scattered to the periphery of the depletion. A cause of these dusts can be presumed as follows from the sectional view in FIG. 14C. Namely, the active silicon layer and the buried oxide layer on the SOI substrate are as thin as 0.1 through 0.2 μm and 0.2 through 0.4 μm, respectively. Therefore, when heated by the laser beams to form the cavities of 2 through 4 μm, the active silicon layer and the buried oxide layer are flicked away in fragments, and these fragments are, it is presumed, scattered to and accumulated along the peripheries of the cavities. These silicon fragments turn out to be dusts that also cause a decline of yield of the transistor.

Further, because of the SOI substrate having the buried oxide layer, a configuration and a color of the mark sued for a mask alignment are different from those in the bulk wafer, and what can be detected on the bulk wafer but can not detected on the SOI substrate. Therefore, even if manufactured in the same process as the bulk wafer, a mark detecting condition only for the SOI substrate is required as the case may be. Further, when obtaining QC (Quality Control) data during the process, a QC data measurement recipe only for the SOI substrate must be created due to the fact that the same measurement as the bulk wafer can not be conducted because of the buried oxide layer existing therein though the process is the same as the bulk wafer.

Moreover, in the case of taking the partial bulk structure described above, the following problem arises if the memory devices are provided in a plurality of regions.

Figure 15A:
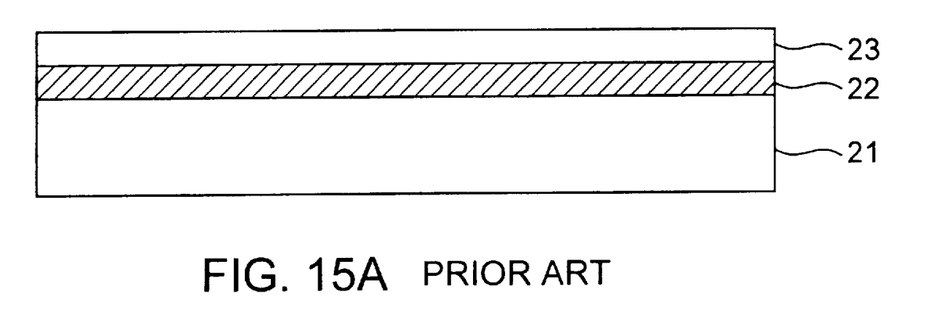
FIGS. 15A through 15C are step-by-step sectional views showing a prior art manufacturing process and a problem inherent therein in the case of providing a plurality of regions formed with memory devices.
Figure 15B:
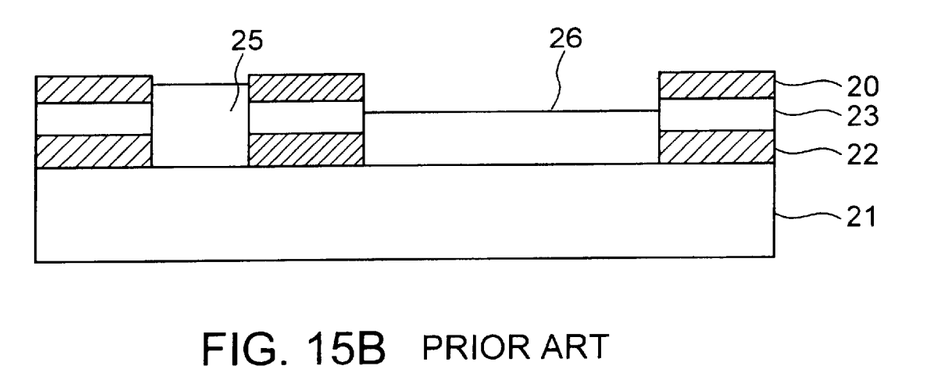
Figure 15C:
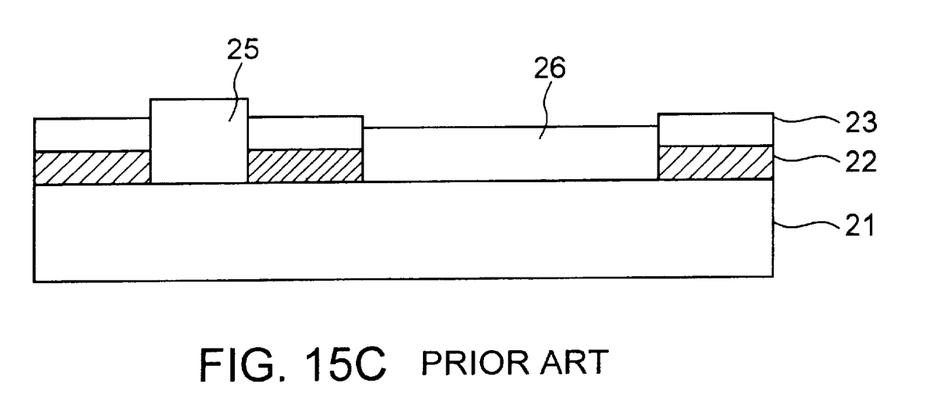

FIGS. 15A through 15C illustrate this problem and are step-by-step sectional views showing manufacturing steps in the case of providing the plurality of regions formed with the memory devices. Referring to FIGS. 15A through 15C, the same components as those in FIG. 13 are marked with the same reference numerals.

An SOI substrate including an buried oxide layer 22 and an upper silicon layer 23 stacked in sequence on a silicon substrate 21, is prepared (FIG. 15A). An insulating layer 20 such as a silicon oxide layer and a unillustrated resist layer are provided thereon, and patterning is effected thereon, thus providing an etching mask. Etching is executed by use of this etching mask, thereby removing the buried oxide layer 22 and the upper silicon layer 23 in the memory device forming region. Openings are thus formed, and subsequently, after removing the resist layer, epitaxial growth layers 25, 26 are provided by effecting the selective epitaxial growth in these openings. As in this example, however, if the opening regions have different areal sizes, a speed of the epitaxial growth differs depending on the openings, with the result that a level difference in filling configuration between the openings occurs (FIG. 15B). Even in a state where the insulating layer 24 is finally removed, the level difference between the epitaxial growth layers 25 and 26 is left (FIG. 15C).

This level difference is a bottleneck in terms of actualizing uniform hyperfine processing, and affects the yield of the product and so on.

SUMMARY OF THE INVENTION

According to a first embodiment of the present invention, there is provided a semiconductor device comprising:

a semiconductor substrate;

an insulating layer provided on said semiconductor substrate;

a first semiconductor layer provided on said insulating layer;

a plurality of openings penetrating said first semiconductor layer and said insulating layer and reaching said semiconductor substrate; and second semiconductor layers filling said openings by selective growth and connected to said semiconductor substrate, wherein areal sizes of said plurality of openings are substantially equal to each other.

According to a second embodiment of the present invention, there is provided a semiconductor device comprising:

a semiconductor substrate;

an insulating layer provided on said semiconductor substrate;

a first semiconductor layer provided on said insulating layer; and an opening penetrating said first semiconductor layer and said insulating layer and reaching said semiconductor substrate, wherein a marking element is formed on the surface of said semiconductor surface that is exposed within said opening.

According to a third embodiment of the present invention, there is provided a semiconductor device comprising:

a semiconductor substrate;

an insulating layer provided on said semiconductor substrate;

a first semiconductor layer provided on said insulating layer;

an opening penetrating said first semiconductor layer and said insulating layer and reaching said semiconductor substrate; and a second semiconductor layer filling said opening by selective growth and connected to said semiconductor substrate, wherein a marking element is formed on the surface of said second semiconductor layer within said opening.

According to a fourth embodiment of the present invention, there is provided a semiconductor device comprising:

a semiconductor substrate;

an insulating layer provided on said semiconductor substrate;

a first semiconductor layer provided on said insulating layer;

a plurality of openings penetrating said first semiconductor layer and said insulating layer and reaching said semiconductor substrate; and second semiconductor layers filling said openings by selective growth and connected to said semiconductor substrate, wherein a marking element is formed on the surface of said second semiconductor layer within a part of said plurality of openings, at least any one category of devices such as DRAM cells, DRAM macro (cells), DRAM sense amplifiers, SRAM sense amplifiers, transistors for analog circuits and I/O transistors, are provided on the surface of the rest of said plurality of second semiconductor layers, and areal sizes of said plurality of openings are substantially equal to each other.

BRIEF DESCRIPTION OF THE DRAWINGS

In the accompanying drawings.

DETAILED DESCRIPTION OF THE INVENTION

A few embodiments of the present invention will hereinafter be described with reference to the accompanying drawings.

Figure 1:
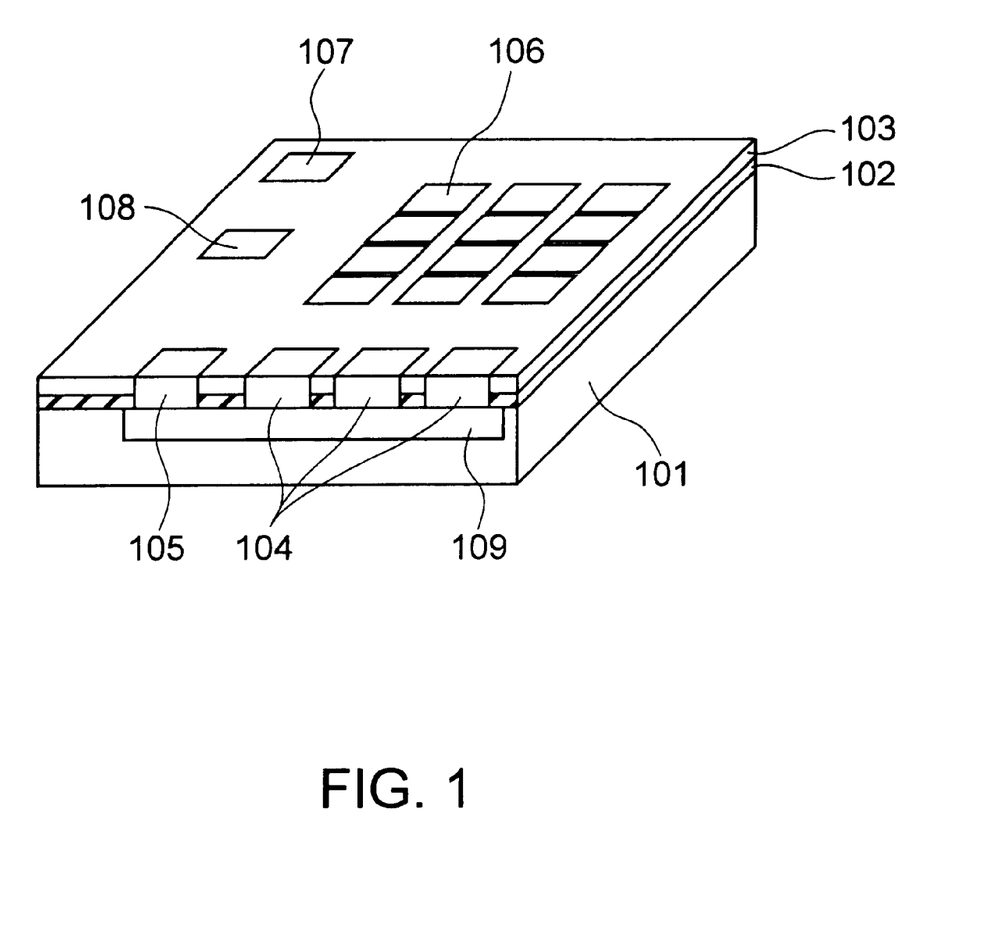
FIG. 1 is an explanatory perspective view with some portion depicted in section, showing a first embodiment of a semiconductor device of the present invention.

FIG. 1 is an explanatory perspective view with some portion depicted in section, showing a first embodiment of a semiconductor device of the present invention. What is illustrated herein is a DRAM configured by use of an SOI substrate.

An buried oxide layer 102 and an upper silicon layer 103 are stacked on a silicon substrate 101. Regions in which to form devices related to the DRAM are provided with silicon mono-crystalline layers formed by selectively effecting an epitaxial growth within openings provided by selectively removing the buried oxide layer 102 and the upper silicon layer 103. For example, the regions seen in front in FIG. 1 are regions 104 to be provided with DRAM peripheral circuits, and a well 109 is provided under these regions 104 by implanting ions at a high speed from the surface of the substrate, whereby substrate electric potentials in the plurality of selective epitaxial growth regions are equalized. Further, a well potential take-out region 105 is also connected to the well 109. Moreover, a DRAM memory macro cell 106, an input/output region 107 composed mainly of an analog device and an electrostatic protection circuit 108 are likewise provided on the epitaxial growth layers within the openings. A sense amplifier is provided in a part of the region 106.

Then, a characteristic of the present invention is that these openings are provided to each have substantially an equal areal size. Namely, a difference between their maximum and minimum areal sizes is within 10% of the minimum areal size. This value, an epitaxial growth speed being substantially reversely proportional to the areal size within a practical range, falls within a range considered necessary for eliminating a scatter in layer thickness due to the epitaxial growth.

Figure 2A:
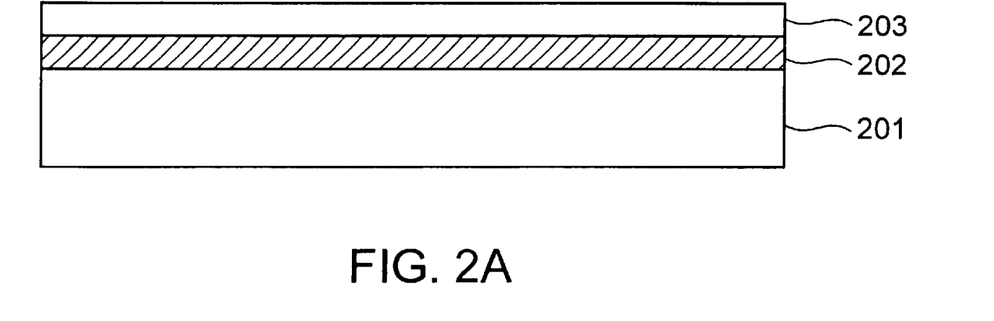
FIGS. 2A through 2C are step-by-step sectional views for explaining an effect obtained by equalizing areal sizes of openings.
Figure 2B:
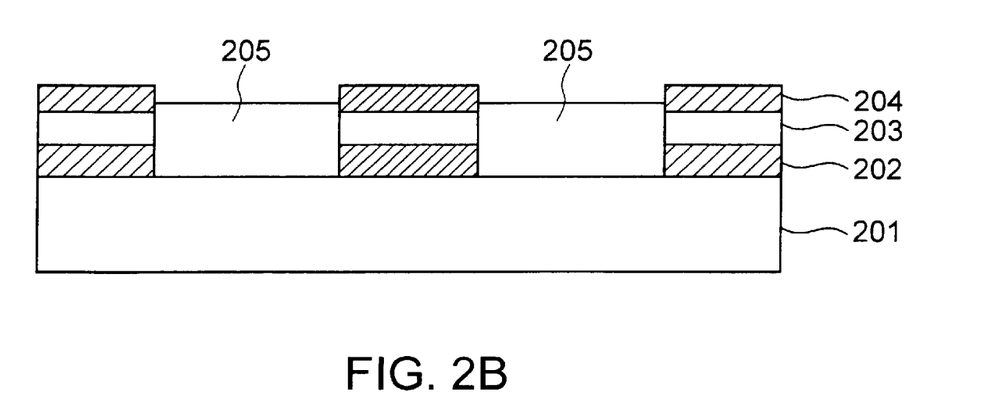
Figure 2C:
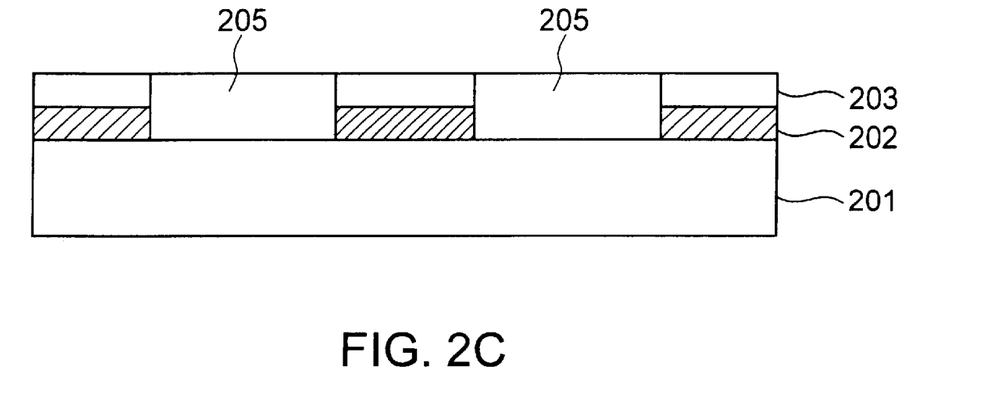

An effect obtained by equalizing the areal sizes of the openings will be explained referring to FIGS. 2A through 2C. FIGS. 2A through 2C correspond to FIGS. 15A through 15C showing the prior art.

An SOI substrate including an buried oxide layer 202 and an upper silicon layer 203 stacked in sequence on a silicon substrate 201, is prepared (FIG. 2A). An insulating layer 204 such as a silicon oxide layer and an unillustrated resist layer are sequentially provided thereon, and then patterned to provide an etching mask. Etching is implemented by use of this etching mask, thereby removing the buried oxide layer 202 and the upper silicon layer 203 in the memory device forming region. Openings are thus formed, and subsequently, after removing the resist layer, an epitaxial growth layer 205 is provided by effecting the selective epitaxial growth in each of these openings.

A condition for this epitaxial growth is that a gas involves the use of dichlorosilane ($SiH_2Cl_2$) of 50 sccm and hydrogen chloride (HCl) of 100 sccm, a temperature is 850° C., and a pressure is 15 Torr. Note that the unit of a reactive gas is cc per minute when executing a nitrogen conversion.

In this case, the respective openings have the equal areal size, the epitaxial growth speed is the same in the respective openings, and any difference in level between the openings doe not occur (FIG. 2B). the epitaxial growth layers 205 are flush with each other even in a state where the insulating layers 204 are finally removed (FIG. 2C).

Accordingly, when the device is provided on the epitaxial growth layer 205 described above, hyperfine processing can be uniformly carried out in the respective openings, thereby improving a yield of the product.

Next, a method of putting an identifying mark on the SOI substrate according to the present invention will be explained referring to FIGS. 3 through 11.

Figure 3:
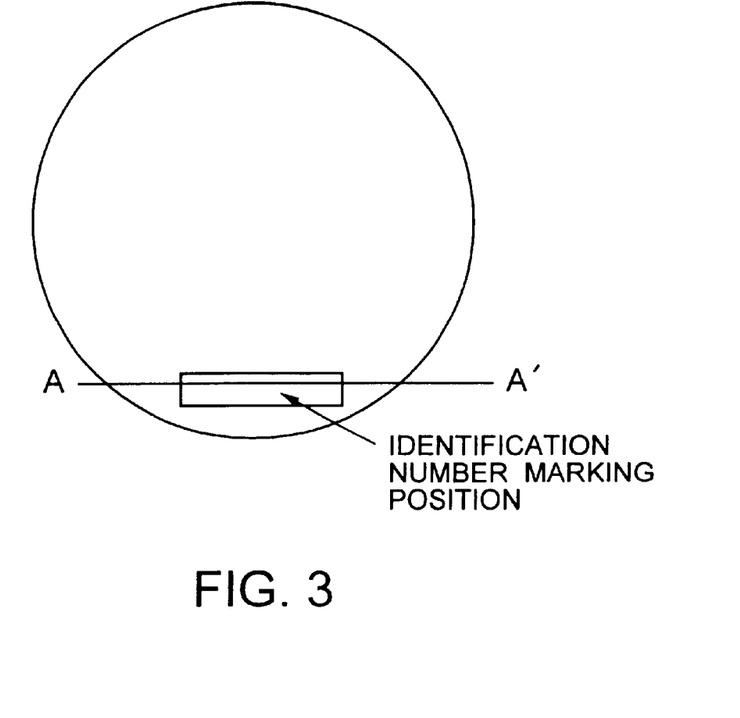
FIG. 3 is a plan view showing a position of making an identification number on an SOI substrate as a wafer.
Figure 4:
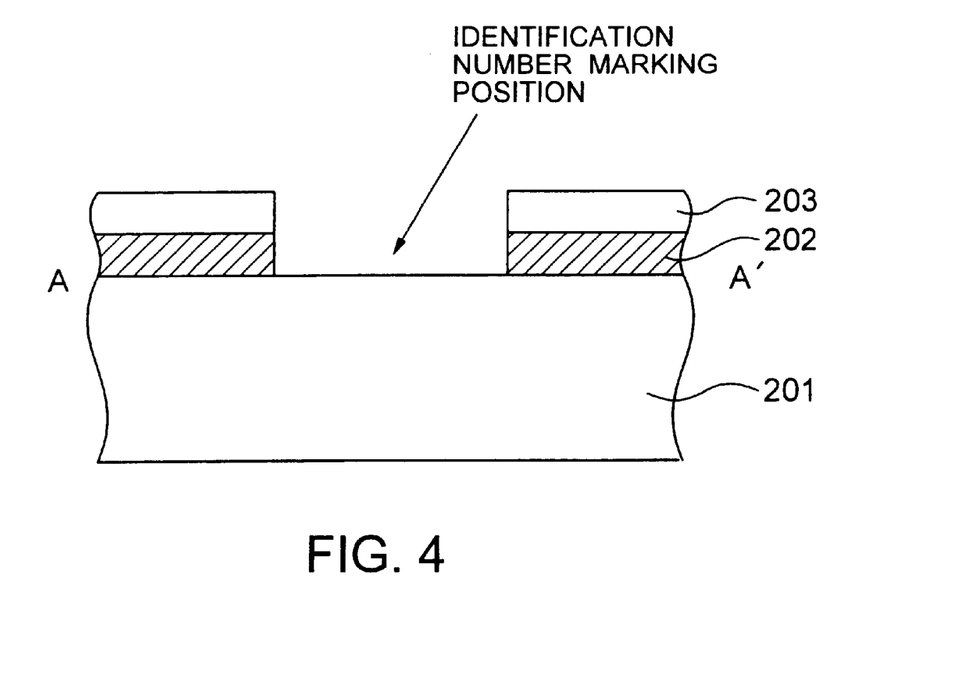
FIG. 4 is a sectional view taken along the line A–A', showing the identification number marking position in FIG. 3.

FIG. 3 is a plan view showing a position where an identification number is marked on the SOI substrate as a wafer. FIG. 4 is a sectional view taken along the line A–A', showing the identification number marking position.

According to this embodiment, in the identification number marking position, the buried oxide layer 202 and the upper silicon layer 203 on the silicon substrate 201 are removed, and the silicon substrate 201 is thus exposed.

This type of laser-based marking process onto the silicon substrate 201 is executed under the same conditions as those for making onto a normal bulk wafer.

Figure 5A:
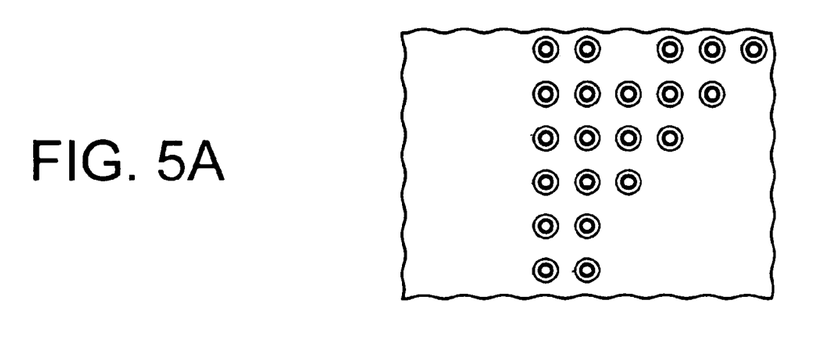
FIGS. 5A through 5C are explanatory views showing a result of marking the identification number according to the present invention.
Figure 5B:
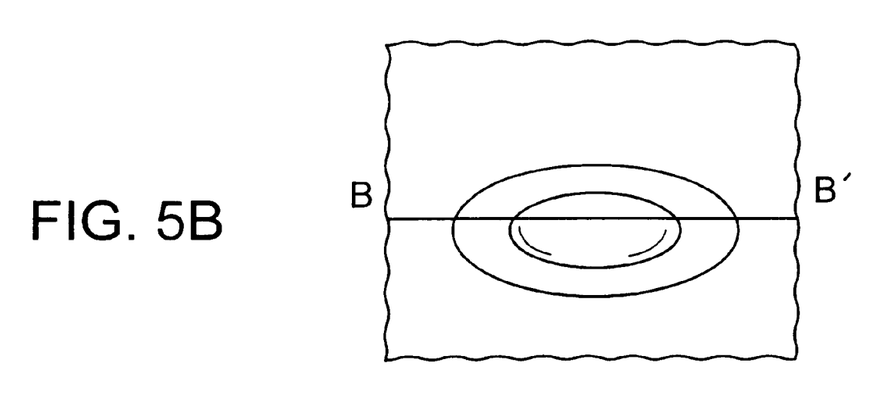
Figure 5C:
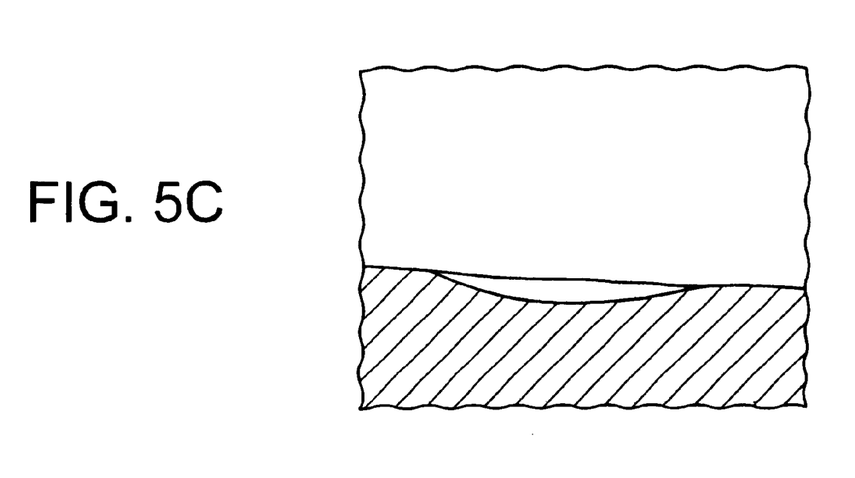

FIGS. 5A through 5C are views each showing a result of marking the identification number according to the present invention. FIG. 5A shows an aggregation of cavities configuring the identification number as viewed from above. FIG. 5B shows the identification number as viewed obliquely from above, in a way that enlarges one of these cavities. FIG. 5C shows the section taken along the line B–' in FIG. 5B.

No occurrence of dusts due to the cavities formed by the laser can be seen in any drawing.

The identification number is herein recorded, however, there may be taken marks needed for a mask alignment and patterns for measuring QC data, or a layout of the marks and the patterns combined.

According to this embodiment, though using the SOI substrate, the identification number, the marks for the mask alignment and the QC patterns (which will hereinafter generically called a marking element) serve the same as the bulk wafer, and hence a recipe created for the bulk device can be used as it is, thereby reducing an LSI development time and essentially a development efficiency. Further, the marking element is formed on the bulk silicon, and it is therefore possible to avoid the occurrence of dust when formed and to prevent a decrease in the yield of the semiconductor device.

Figure 6:
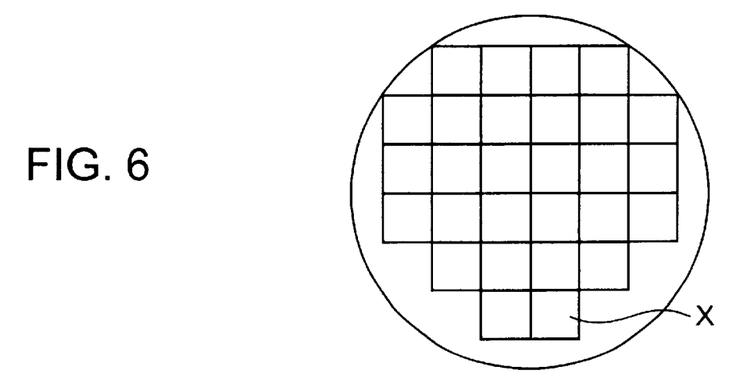
FIG. 6 is a plan view showing a relationship between the wafer and a chip.
Figure 7:
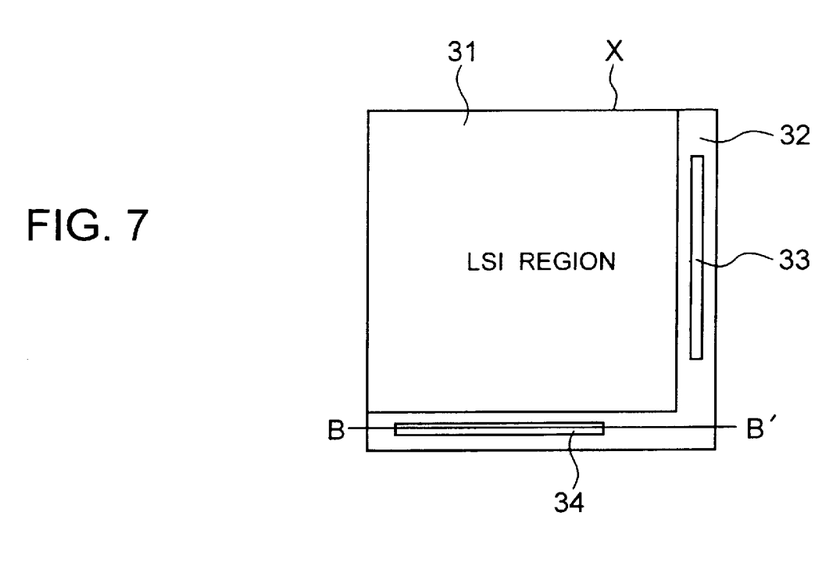
FIG. 7 is an enlarged view showing one chip X in the wafer shown in FIG. 6.
Figure 8:
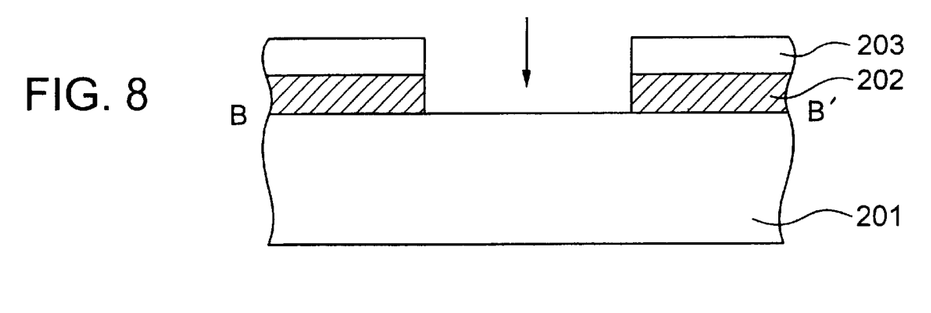
FIG. 8 is a sectional view taken along the line B–B' in FIG. 7.

FIGS. 6 through 8 are explanatory views each showing a method of forming the marking element in a second embodiment. FIG. 7 is an enlarged view of one chip X in the wafer shown in FIG. 6. As obvious from FIG. 7, identifying marks 33, 34 are formed within a dicing line 32 extending outside of an LSI region 31 in the chip. In this case also, in the section taken along the line B–B', as shown in FIG. 8, the buried oxide layer 202 and the upper silicon layer 203 on the silicon substrate 201 are removed, and the silicon substrate 201 is exposed.

Figure 9:
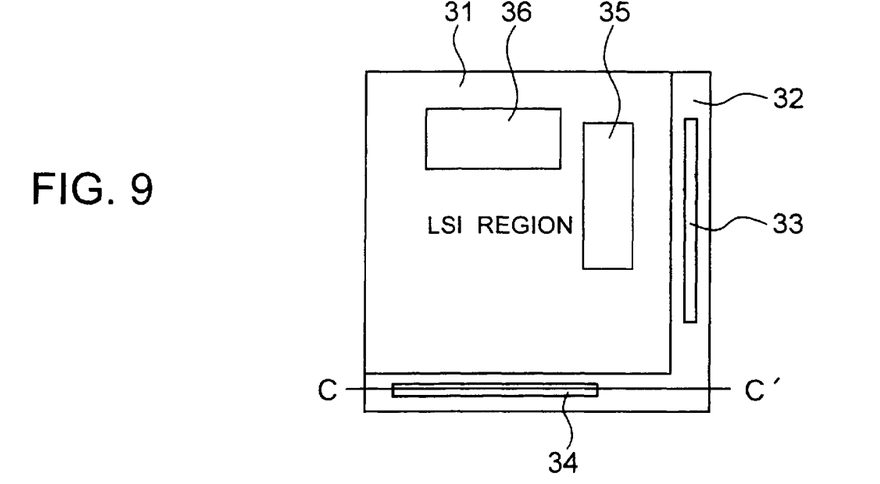
FIG. 9 is a plan view showing another embodiment of the present invention.
Figure 10:
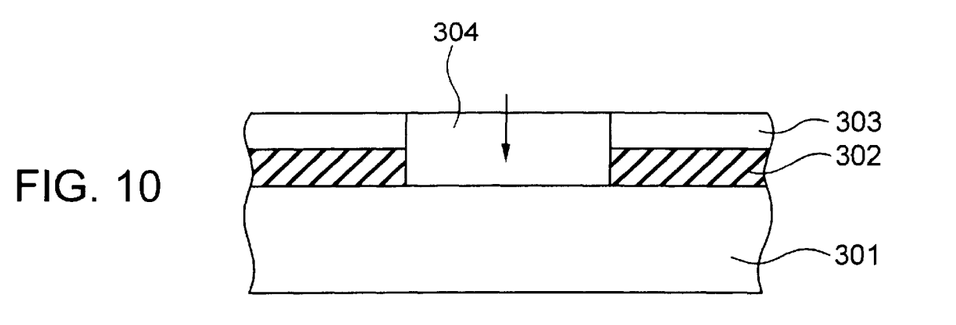
FIG. 10 is a sectional view taken along the line C–C', showing a marking element in FIG. 9.

FIG. 9 is a plan view showing a third embodiment as still another embodiment thereof according to the present invention. FIG. 10 is a sectional view taken along the line C–C', showing the marking element.

In the third embodiment, as in the case of FIG. 7, the marking elements 33, 34 are formed within the dicing line 32, and regions 35, 36 for providing memory devices are formed in a part of the LSI region. FIG. 10 is a sectional view of the marking element 34. Then, in these marking elements 33, 34 and the regions 35, 36, as shown in FIG. 10, an buried oxide layer 302 and an upper silicon layer 303 on a silicon substrate 301 are removed, and a silicon monocrystalline layer 304 is provided by the epitaxial growth within an opening formed by this removal.

In the case where the marking element is provided on the epitaxial growth layer, the conditions when formed is substantially the same as those for the bulk wafer, so that the marking element with no occurrence of dust as shown in FIG. 5 can be obtained.

Figure 11:
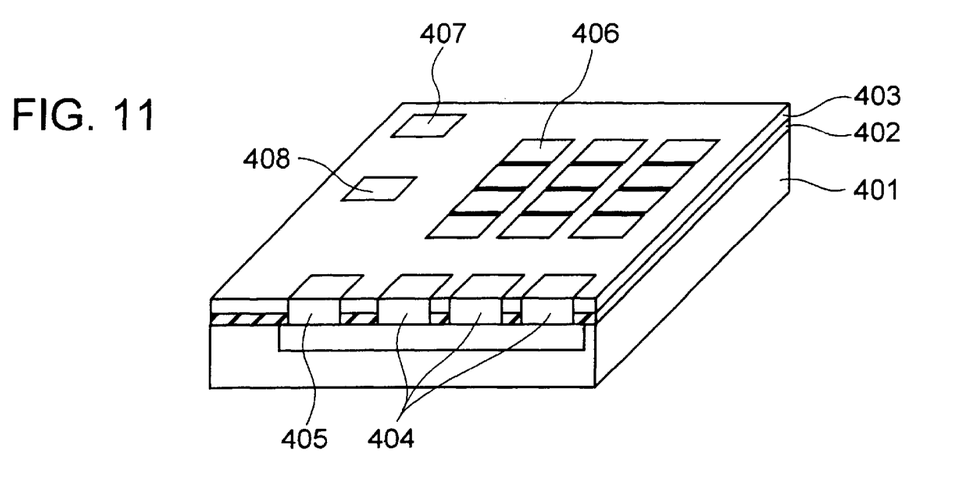
FIG. 11 is a plan view showing STILL another embodiment into which the embodiment illustrated in FIG. 9 is developed.

FIG. 11 is an explanatory plan view showing a fourth embodiment into which the embodiment illustrated in FIG. 9 is developed, wherein the areal sizes of the openings in which to form the epitaxial layers are substantially equalized as in the embodiment illustrated in FIG. 1.

Namely, an buried oxide layer 402 and an upper silicon layer 403 are stacked on a silicon substrate 401. In regions in which to form devices related to the DRAM and regions for providing the marking elements, the silicon monocrystalline layers are provided by selectively effecting the epitaxial growth in the openings formed by selectively removing the buried oxide layer 402 and the upper silicon layer 403. For example, regions 404 seen in front in FIG. 11 are provided with DRAM peripheral circuits, a well potential take-out region 405, a DRAM memory macro cell 406, an input/output region 407 composed mainly of an analog device and a marking element 408 are all provided on the epitaxial growth layers within the openings each having the same areal size.

In this embodiment, it is feasible to attain an improvement of the yield by providing the devices on the epitaxial layers with no difference level obtained by equalizing the areal sizes, and also the decrease in the occurrence of dust owing to the formation of the marking element on the epitaxial layer and a resultant improvement of the yield.

In each of the embodiments discussed above, the categories of the circuits and the devices provided on the selectively formed epitaxial layers can be applied to whatever circuits and devices other than those exemplified.

As discussed above, according to the embodiments of the present invention, when providing the devices in the openings formed by selectively removing the embedded insulating layer and the upper semiconductor layer on the SOI substrate, the level difference can be prevented from occurring by substantially equalizing the areal sizes of the respective openings, thereby enabling the uniform hyperfine processing to be executed. This can lead to the improvement of the yield.

Further, according to the embodiments of the present invention, the mark such as the identification number etc formed on the SOI substrate is formed on the surface of the semiconductor substrate exposed within the opening provided by selectively removing the embedded insulating layer and the upper semiconductor layer or on the epitaxial growth layer provided within this opening, whereby the conditions can be set the same as those for the bulk wafer and the yield can be improved by restraining the occurrence of dust.

The occurrences of the level difference and the dust are restrained by substantially equalizing the areal sizes of the openings for the epitaxial growth layer on which to form the marking element and for the epitaxial growth layer on which to form the device, whereby the yield can be improved.

What is claimed is:

1. A semiconductor device comprising:
   a semiconductor substrate;
   an insulating layer provided on said semiconductor substrate;
   a first semiconductor layer provided on said insulating layer;
   a plurality of openings penetrating said first semiconductor layer and said insulating layer and reaching said semiconductor substrate; and
   second semiconductor layers filling said openings by selective growth and connected to said semiconductor substrate,
   wherein areal sizes of said plurality of openings are substantially equal to each other, and
   a difference between maximum and minimum areal sizes of said plurality of openings falls within 10% of the minimum areal size thereof.

2. The semiconductor device according to claim 1, wherein said second semiconductor layers tilling said plurality of openings are connected to a diffused layer provided on said semiconductor substrate, and
   at least one of said openings is used for taking out an electric potential of said diffused layer.

3. The semiconductor device according to claim 1, wherein at least one of a DRAM cell, a DRAM macro cell, a DRAM sense amplifier, an SRAM sense amplifier, a transistor for an analog circuit and an I/O transistor; is provided on said second semiconductor layer.

4. The semiconductor device according to claim 3, wherein said second semiconductor layers filling said plurality of openings are connected to a diffused layer provided on said semiconductor substrate, and
   at least one of said openings is used for taking out an electric potential of said diffused layer.

5. A semiconductor device comprising:
   a semiconductor substrate;
   an insulating layer provided on said semiconductor substrate;
   a first semiconductor layer provided on said insulating layer; and
   an opening penetrating said first semiconductor layer and said insulating layer and reaching said semiconductor substrate,
   wherein a marking element is formed on the surface of said semiconductor surface that is exposed within said opening.

6. The semiconductor device according to claim 5, wherein said marking element is at least any one of a number for identification, a mark for mask alignment and a pattern for obtaining data for quality management.

7. A semiconductor device comprising:
   a semiconductor substrate;
   an insulating layer provided on said semiconductor substrate;
   a first semiconductor layer provided on said insulating layer;
   an opening penetrating said first semiconductor layer and said insulating layer and reaching said semiconductor substrate; and
   a second semiconductor layer filling said opening by selective growth and connected to said semiconductor substrate,
   wherein a marking element is formed on the surface of said second semiconductor layer within said opening.

8. The semiconductor device according to claim 7, wherein said marking element is at least any one of a number for identification, a mark for mask alignment and a pattern for obtaining data for quality management.

9. A semiconductor device comprising:

a semiconductor substrate;

an insulating layer provided on said semiconductor substrate;

a first semiconductor layer provided on said insulating layer;

a plurality of openings penetrating said first semiconductor layer and said insulating layer and reaching said semiconductor substrate; and second semiconductor layers filling said openings by selective growth and connected to said semiconductor substrate, wherein a marking elements formed on the surface of said second semiconductor layer within a part of said plurality of openings, at least any one category of devices such as DRAM cells, DRAM macro cells, DRAM sense amplifiers, SRAM sense amplifiers, transistors for analog circuits and I/O transistors, are provided on the surface of the rest of said plurality of second semiconductor layers, and areal sizes of said plurality of openings are substantially equal to each other.

10. The semiconductor device according to claim 9, wherein a difference between maximum and minimum areal sizes of said plurality of openings falls within 10% of the minimum areal size thereof.

11. A semiconductor device comprising:

a semiconductor substrate;

an insulating layer provided on said semiconductor substrate;

a first semiconductor layer provided on said insulating layer;

a plurality of second semiconductor layers which lead from vicinity of a surface of said first semiconductor layer to said semiconductor substrate;

wherein a difference among maximum and minimum areal sizes of said second semiconductor layers fails within 10% of the minimum areal size thereof.

12. The semiconductor device according to claim 11, wherein said second semiconductor layers are connected to a diffused layer provided on said semiconductor substrate, and at least one of said second semiconductor layers is used for taking out an electric potential of said diffused layer.

13. The semiconductor device according to claim 11, wherein a memory cell is provided on each of said plurality of second semiconductor layers.

14. The semiconductor device according to claim 13, wherein said memory cell is a DRAM cell.

15. The semiconductor device according to claim 11, wherein at least one of a DRAM cell, a DRAM macro cell, a DRAM sense amplifier, an SRAM sense amplifier, a transistor for an analog circuit and an I/O transistor is provided on said second semiconductor layer.

* * * * *